(12) United States Patent
Tomie et al.

(10) Patent No.: US 9,859,185 B2
(45) Date of Patent: Jan. 2, 2018

(54) SEMICONDUCTOR PACKAGING STRUCTURE AND PACKAGE HAVING STRESS RELEASE STRUCTURE

(71) Applicant: Kyocera International, Inc., San Diego, CA (US)

(72) Inventors: Satoru Tomie, Kirishima (JP); Mark Eblen, San Diego, CA (US); Eiji Watanabe, Kirishima (JP); Eiji Tanaka, San Diego, CA (US)

(73) Assignee: Kyocera International, Inc., San Diego, CA (US)

( * ) Notice: Subject to any disclaimer, the term of this patent is extended or adjusted under 35 U.S.C. 154(b) by 0 days.

(21) Appl. No.: 15/418,109

(22) Filed: Jan. 27, 2017

(65) Prior Publication Data

US 2017/0221790 A1 Aug. 3, 2017

Related U.S. Application Data

(60) Provisional application No. 62/288,034, filed on Jan. 28, 2016.

(51) Int. Cl.
| | | |
|---|---|---|
| *H01L 23/367* | (2006.01) | |
| *H01L 23/10* | (2006.01) | |
| *H01L 49/02* | (2006.01) | |
| *H01L 23/00* | (2006.01) | |

(Continued)

(52) U.S. Cl.
CPC .......... *H01L 23/367* (2013.01); *H01L 23/057* (2013.01); *H01L 23/10* (2013.01); *H01L 23/3736* (2013.01); *H01L 24/48* (2013.01); *H01L 28/40* (2013.01); *H01L 2224/48139* (2013.01); *H01L 2224/48155* (2013.01)

(58) Field of Classification Search
CPC ..... H01L 23/057; H01L 23/10; H01L 23/367; H01L 23/3736; H01L 24/48; H01L 28/40; H01L 2224/48139; H01L 2224/48155
See application file for complete search history.

(56) References Cited

U.S. PATENT DOCUMENTS

| | | | | |
|---|---|---|---|---|
| 3,808,474 A | * | 4/1974 | Cooke | ............... H01L 23/66 |
| | | | | 257/706 |
| 4,427,991 A | * | 1/1984 | Yamamura | ............ H01L 23/047 |
| | | | | 257/664 |

(Continued)

FOREIGN PATENT DOCUMENTS

KR 10-2003-0028462 A 4/2003

*Primary Examiner* — Peniel M Gumedzoe (57) ABSTRACT

A semiconductor packaging structure includes a copper heat-sink with a shim projection which provides a stress release structure. The heat-sink with the shim projection may be used in conjunction with a pedestal in order to further reduce the thermal stress produced from the mismatch of thermal properties between the copper heat-sink metal and the ceramic frame. The copper heat-sink with a shim projection may also be part of the semiconductor package along with a lead frame, the ceramic frame, a semiconductor device, a capacitor, a wire bond and a ceramic lid or an encapsulation. The copper heat-sink, the ceramic frame and the lead frame are all chosen to be cost effective, and chosen such that the packaging process for the semiconductor device is able to achieve a smaller size while maintaining high reliability, low cost, and suitability for volume manufacturing.

17 Claims, 10 Drawing Sheets (51) Int. Cl.
    *H01L 23/373*    (2006.01)
    *H01L 23/057*    (2006.01)

(56) References Cited

U.S. PATENT DOCUMENTS

| | | | |
|---|---|---|---|
| 4,672,417 A * | 6/1987 | Sugiyama | H01L 23/047 257/712 |
| 4,908,694 A * | 3/1990 | Hidaka | H01L 23/49844 257/664 |
| 6,455,932 B1 * | 9/2002 | Katahira | H01L 23/10 257/664 |
| 6,559,533 B1 * | 5/2003 | Yamamoto | H01L 23/10 257/705 |
| 2001/0038140 A1 * | 11/2001 | Karker | H01L 23/057 257/666 |
| 2006/0022331 A1 | 2/2006 | Shinohara et al. | |
| 2007/0090514 A1 * | 4/2007 | Condie | H01L 23/10 257/704 |
| 2011/0156085 A1 | 6/2011 | Lin et al. | |
| 2012/0104582 A1 | 5/2012 | Mohammed et al. | |
| 2013/0105994 A1 | 5/2013 | Colgan et al. | |

\* cited by examiner

Shim Projection Ratio = H(Height)/W(Width)

SEMICONDUCTOR PACKAGING STRUCTURE AND PACKAGE HAVING STRESS RELEASE STRUCTURE

RELATED APPLICATIONS

The application claims the benefit of priority of U.S. Provisional Patent Application Ser. No. 62/288,034, entitled "SEMICONDUCTOR PACKAGE HAVING STRESS RELEASE STRUCTURE", filed on Jan. 28, 2016, and incorporated by reference in its entirety, herein.

BACKGROUND

Semiconductor devices are used as amplifiers for high power microwave transmissions. These devices are part of base station and mobile systems of wireless networks used for telecommunications and metro communications. For example, a semiconductor device may be a Gallium nitride (GaN) transistor or a GaN Microwave Monolithic Integrated Circuit (MMIC) used as a high power amplifier. Recently, device power is increasing in high performance small size die. As such, more cost effective solutions are needed as these amplifiers increase in number and replace current amplifiers.

The heat-sink material must be chosen to have high thermal dissipation. It should also be suitable for volume manufacturing. In general, amplifiers and packages which are smaller in size and can be manufactured in volume tend to be more cost effective than larger ones which require a special metal heat-sink.

For the packaging of semiconductor devices, copper/tungsten (Cu/W) or copper/molybdenum (Cu/Mo) composites are frequently used in the fabrication of their heat-sinks. However, these heat-sink materials do not have enough thermal dissipation to manage the heat generated by high power semiconductor devices. Other materials used in heat sinks, for example, special composite materials with diamond or carbon powder, have been developed to manage good thermal conductivity. However, these special materials, especially those with diamond or other carbon components, tend to be very expensive. In addition, these materials may experience difficulties in the manufacturing process, such as having good yield during plating and brazing, which in turn affects their suitability for volume manufacturing.

The copper materials discussed above also have high thermal expansion, which does not match well to the coefficient of thermal expansion of a ceramic frame. The coefficient of thermal expansion difference between the copper materials and a ceramic frame is too great to manage the extremes of an environmental test. If the environmental test is not managed adequately, then the reliability of the semiconductor device and semiconductor package will be lower, and failure of the semiconductor device and semiconductor package may occur. Thus, there is a need for an improved semiconductor package.

SUMMARY

A semiconductor packaging structure includes a copper heat-sink with a shim projection which provides a stress release structure. The heat-sink with the shim projection may be used in conjunction with a pedestal in order to further reduce the thermal stress produced from the mismatch of thermal properties between the copper heat-sink metal and the ceramic frame. The copper heat-sink with a shim projection may also be part of the semiconductor package along with a lead frame, the ceramic frame, a semiconductor device, a capacitor, a wire bond and a ceramic lid or an encapsulation. The copper heat-sink, the ceramic frame and the lead frame are all chosen to be cost effective, and chosen such that the packaging process for the semiconductor device is able to achieve a smaller size while maintaining high reliability, low cost, and suitability for volume manufacturing.

BRIEF DESCRIPTION OF THE DRAWINGS

It is to be understood that the drawings are solely for a purpose of illustration and do not define the limits of the invention(s). Furthermore, the components in the figures are not necessarily to scale. In the figures, like reference numerals designate corresponding parts throughout the different views.

DETAILED DESCRIPTION

Figure 1:
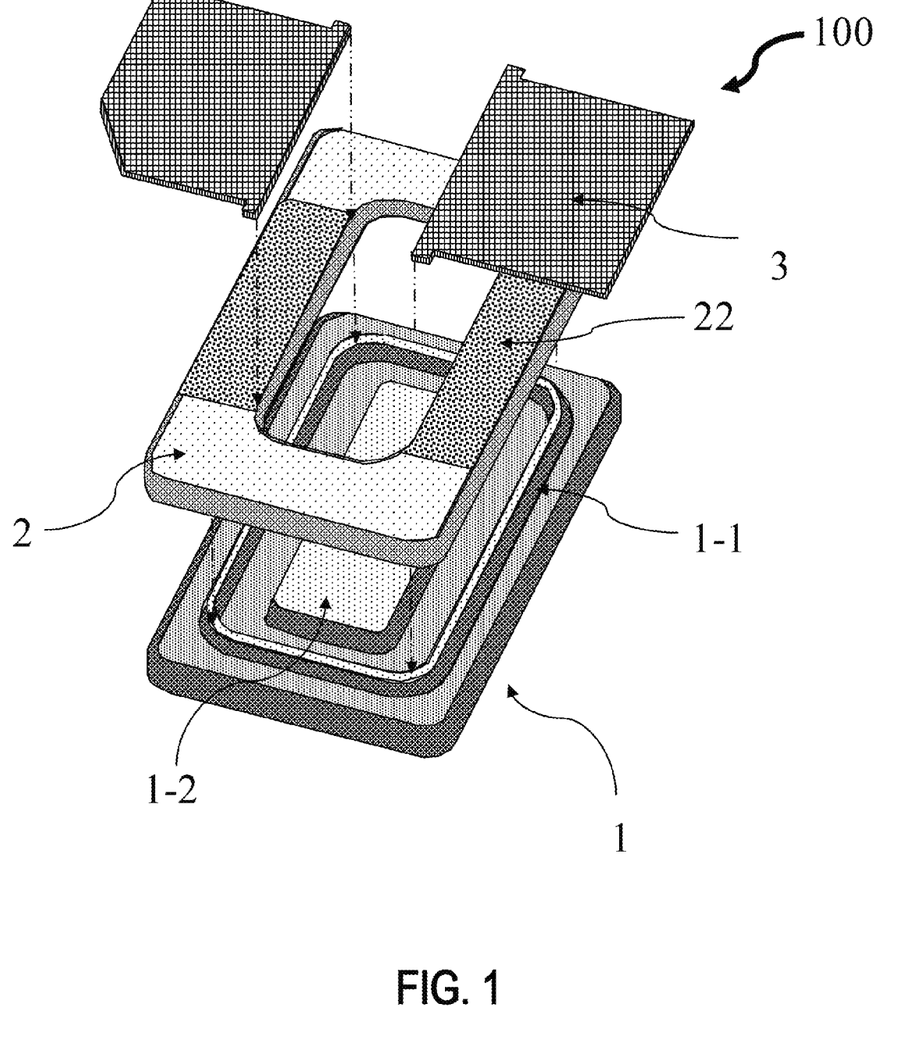
FIG. 1 is an exploded view of a structure of a semiconductor package, including a stress release structure.

FIG. 1 depicts a structure of a semiconductor package 100, which includes a stress release structure. The semiconductor package 100 includes a heat-sink 1. The heat-sink 1 may be constructed of copper or other copper material as discussed below. The copper heat-sink 1 may also form a part of the semiconductor package. The copper heat-sink 1 has a shim projection 1-1. The copper heat-sink may also have a pedestal 1-2 for mounting semiconductor devices and components. The semiconductor package 100 also includes a lead frame 3. The lead frame includes terminals to connect to a semiconductor device or a component. The lead frame 3 is electrically isolated from copper heat-sink 1 by using a ceramic frame 2 with a metallization 22. The lead frame 3 is attached on the ceramic frame 2, and the ceramic frame 2 is attached the heat-sink 1 by using a braze, a solder, or a glue. The semiconductor package has a plating for device attach and wire bonding for component assembly.

Figure 2:
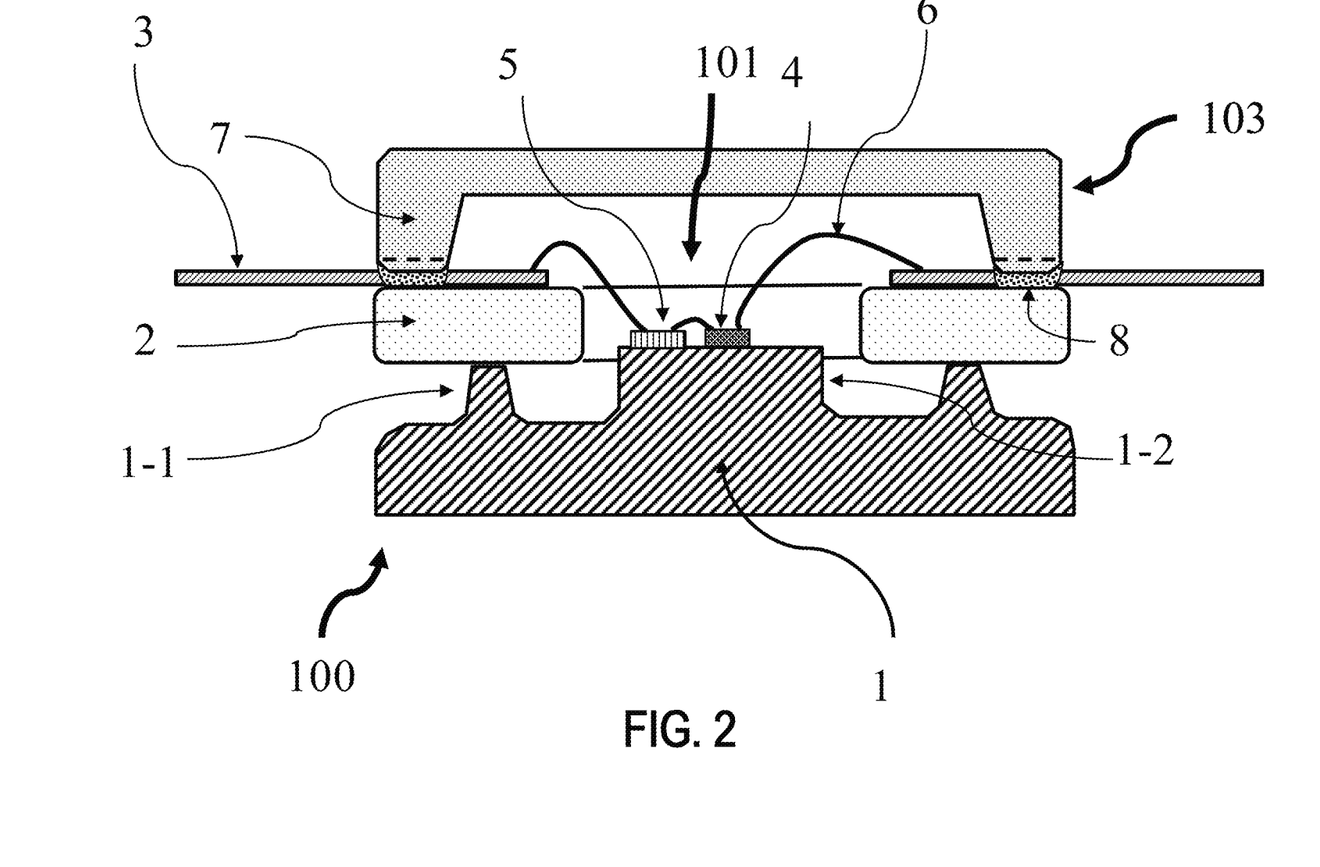
FIG. 2 is a cross section of a semiconductor packaging structure and semiconductor package with a hermetic lid.
Figure 3:
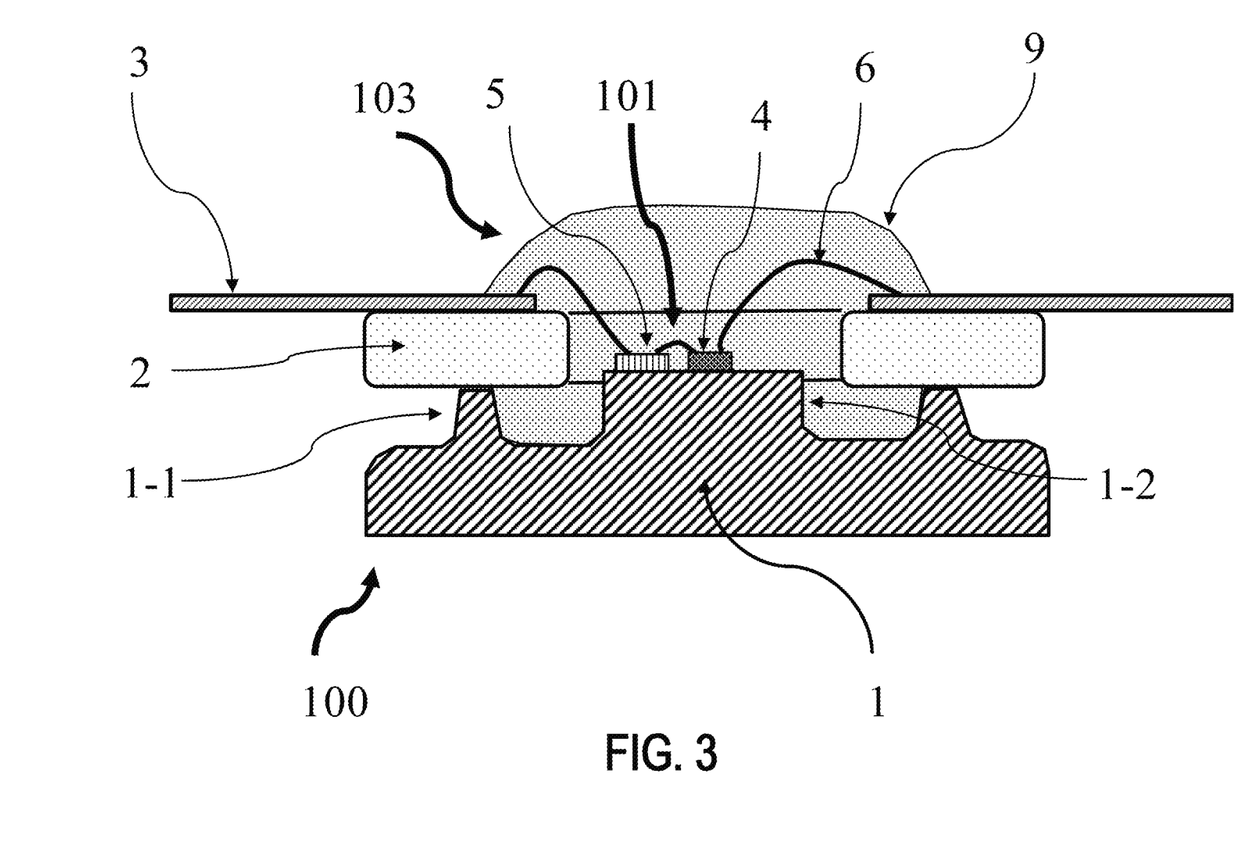
FIG. 3 is a cross section of a semiconductor packaging structure and semiconductor package with a non-hermetic encapsulation.

FIG. 2 depicts a cross section of the semiconductor packaging structure. It includes a semiconductor device 4 and a capacitor 5. Wire bond 6 is a connection between the semiconductor package 100, and an internal semiconductor device and component 101. FIG. 2 includes a hermetic lid 7 with adhesive material 8 which provide a sealing structure 103 for the semiconductor package. It is also possible to use a different sealing structure 103, such as an encapsulation 9 as depicted in FIG. 3 as a non-hermetic sealing method.

The ceramic frame 2 normally is an alumina material with high reliability and good adhesive metallization, and is capable of being manufactured in volume. However, the copper heat-sink 1 has a relatively high Coefficient of Thermal Expansion (CTE) of 17 ppm/° C. (40° C. to 400° C.). The alumina ceramic frame 2 typically has a CTE of 7 ppm/° C. (40° C. to 400° C.). During an environmental test, the semiconductor package will have to withstand a thermal cycling test. The temperature range after the semiconductor device assembly for checking reliability via thermal cycling is from −65° C. to +150° C. for a 500 cycle test. In the semiconductor package 100, the copper heat-sink 1 has the shim projection 1-1 which acts as a stress release structure for the difference of between the CTE of the ceramic frame and the copper heat-sink.

Figure 4:
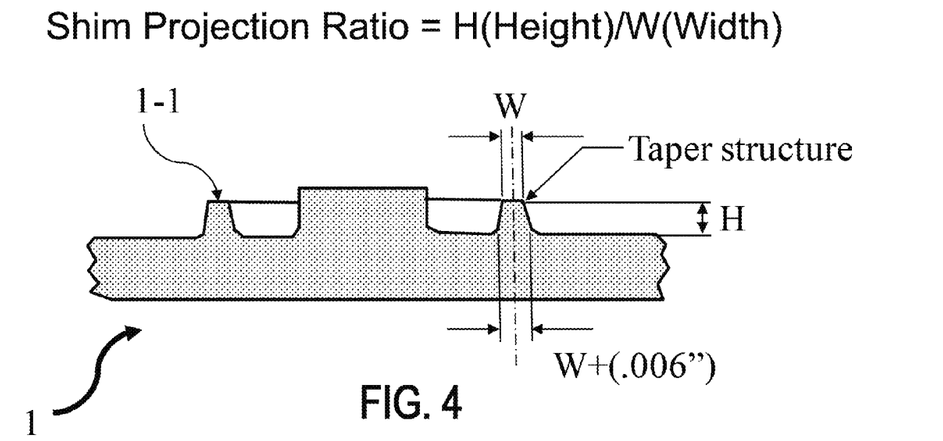
FIG. 4 is a cross section of a heat-sink, displaying the dimensions of a shim projection for a semiconductor package.

FIG. 4 depicts a cross section of a heat-sink 1 along with the dimensions of a shim projection for a semiconductor package. A shim projection ratio "Height (H)/Width (W)" is a key parameter for the stress release structure. The shim may also be tapered as shown in FIG. 4. For example, the width of the top of the shim projection 1-1 is "Width (W)" while the width at foot of the shim projection 1-1 is "Width (W)+0.006 inch." A tapered structure may make it easier to produce in volume via a stamping process with less residual stress.

Figure 5:
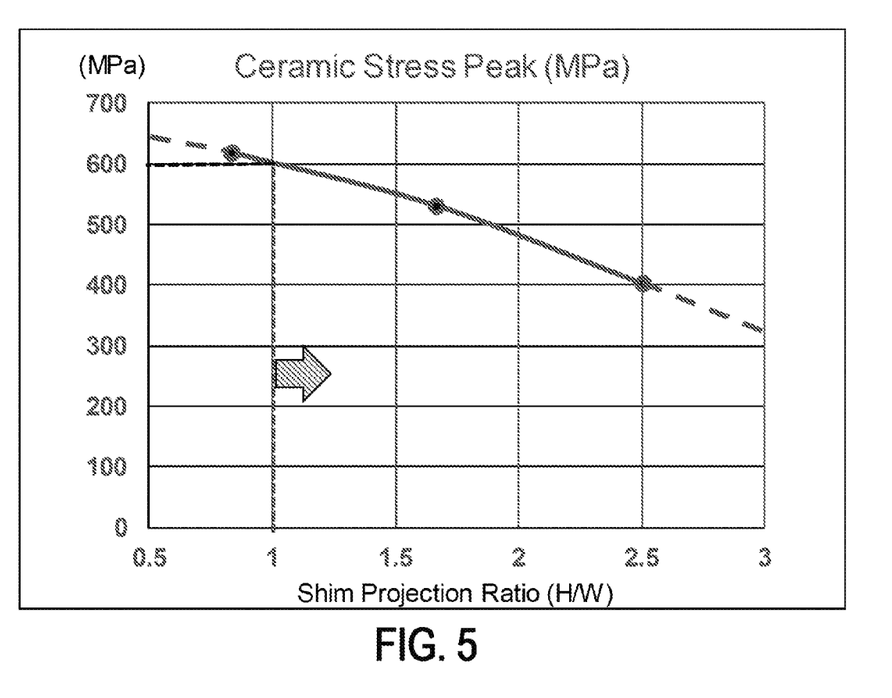
FIG. 5 shows simulated test results regarding a ceramic stress peak on each shim projection H/W ratio of a heat-sink for a semiconductor package.

FIG. 5 illustrates the ceramic stress peak for each shim projection ratio of heat-sink for the semiconductor package during a thermal cycling test. A thermal cycling test may cycle temperatures from −65° C. to +150° C. for 500 cycles. At the shim projection ratio Height (H)/Width (W)=1.0, the ceramic stress peak is 600 MPa, which is maximum strength level for ceramic strength to with stand the thermal cycling test. Thus, the ratio Height (H)/Width (W)>1.0 design condition of the shim projection produces the outstanding stress release effect as shown in the graph of FIG. 5.

The copper heat-sink 1 has a good thermal conductivity, which is 391 W/m*K. The thermal conductivity is higher than that of any major copper alloy material, such a copper/tungsten or a copper/molybdenum composite, or a clad type metal. In addition, the copper material is softer than other materials, making it suitable for a stamping process. Therefore, the metal parts cost for such a heat-sink is at a lowest level for volume production. The copper heat-sink 1 is either pure copper, or alternatively, more than 97.5 w % copper, with the remainder comprised of at least one element from the group consisting of iron (Fe), nickel (Ni), tin (Sn), zirconium (Zr), chromium (Cr), cobalt (Co) and phosphorus (P), which all have a thermal conductivity of more than 300 W/m*K.

The ceramic frame 2 and the hermetic lid 7 may be comprised of ceramic material including, but not limited to, alumina, aluminum nitride, zirconia, forsterite, steatite, silicon carbide and silicon nitride. The metallization 22 may be comprised of a high temperature (>700° C.) fired metallization including, but not limited to, Tungsten (W), Molybdenum (Mo), Moly-Manganese (MoMn), Copper (Cu), Silver (Ag), Gold (Au), Titanium (Ti), Platinum (Pt), Nichrome (NiCr), Ag—Cu—Ti alloy (active filler metal), and other adhesive metallizations.

The lead frame 3 may include a Fe—Ni alloy, Fe—Ni—Co alloy, Cu—Ni alloy, Cu, Ni, Fe and/or other metals with equivalent performance.

The copper heat-sink 1, the ceramic frame 2 and the lead frame 3 are attached by brazing material or adhesive material including, but not limited to AgCu, AuGe, AuSi, AuSn, PbSn, Pb free solder, any other solders or glues.

Figure 6:
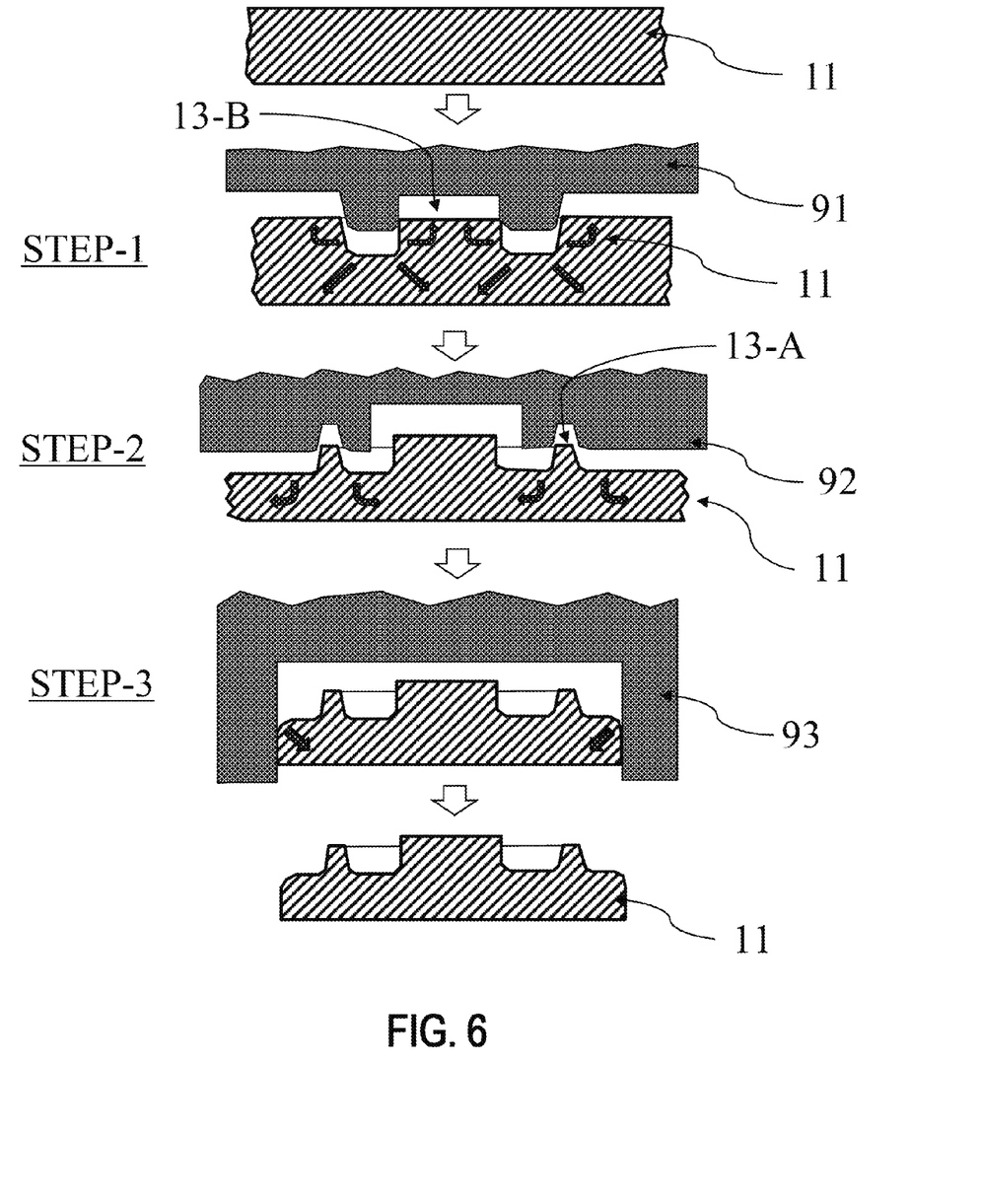
FIG. 6 is an illustration depicting a heat-sink stamp process for making a semiconductor package.

FIG. 6 is an illustration depicting the steps of making a heat-sink via a stamping process for a semiconductor package. The process flow shows a copper metal sheet 11. A pedestal 13-B is made via stamping on the copper metal 11 at a step-1. At step-2, a shim projection 13-A is made on a copper metal 11. At step-3, a cutting outline is made of the copper metal 11. The shim projection 13-A and the pedestal 13-B may be produced from these steps by using upper stamp tools 91, 92 and 93 on a progressive stamping process in volume production.

Figure 7:
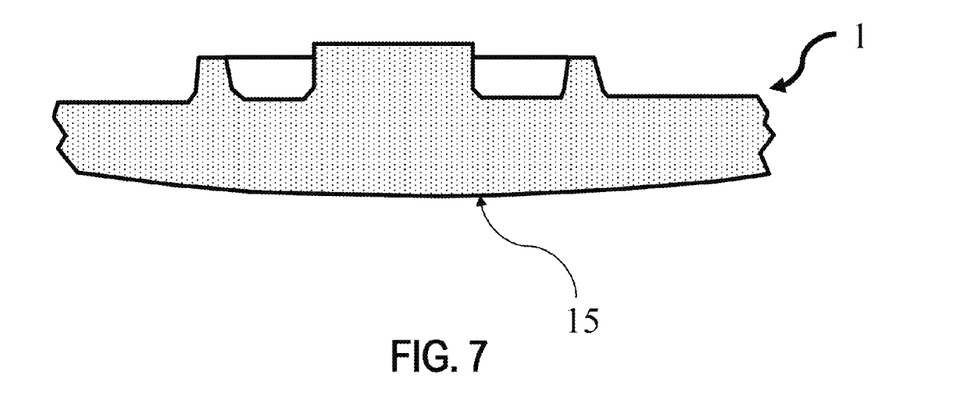
FIG. 7 is a cross section view of a convex structure of a heat-sink for a semiconductor package.

FIG. 7 is a cross section view of copper heat-sink 1 of the semiconductor package, in which heat-sink 1 has a convex structure. The heat-sink 1 has a convex structure 15 on a bottom surface in order to compensate for a concave structure forming after temperature cycling test. The copper heat-sink 1 has a relatively high CTE (Coefficient of Thermal Expansion) 17 ppm/° C. (40° C. to 400° C.) while the alumina ceramic frame has CTE 7 ppm/° C. (40° C. to 400° C.). The convex structure will reduce the stress within the semiconductor due to CTE of the copper heat-sink being higher than CTE of the ceramic frame.

Figure 8:
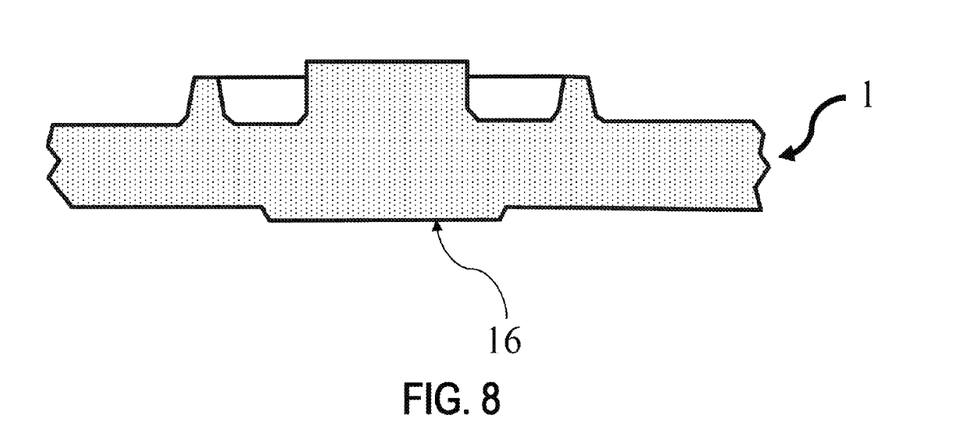
FIG. 8 is a cross section view of a stepped structure of a heat-sink for a semiconductor package.

FIG. 8 is a cross section view of copper heat-sink 1 of the semiconductor package in which heat-sink 1 has a stepped structure. The copper heat-sink 1 has the stepped structure 16 on the bottom surface in order to prevent functionality of the heat-sink being deteriorated because of inadequate thermal dissipation and electrical grounding due to a concave structure being formed at the bottom of the heat-sink after a thermal cycling test.

Figure 9:
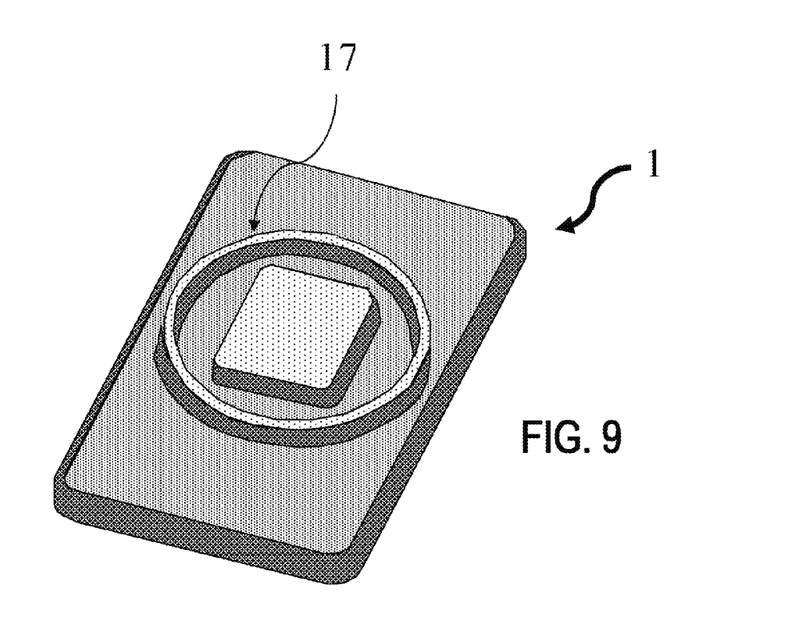
FIG. 9 is a top view of a heat-sink including a shim projection with a round shape for a semiconductor package.

FIG. 9 is a top view of heat-sink 1, which includes the shim projection in a round shape for the semiconductor package. The round-shaped shim projection 17 scatters the stress peak on the ceramic frame due to the differentiation between the CTE of the copper heat-sink 1 and the ceramic frame.

Figure 10:
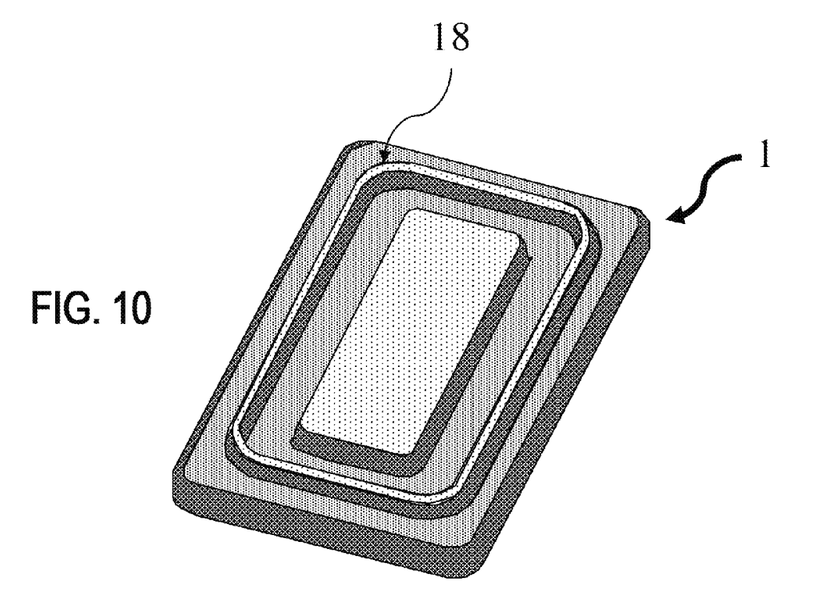
FIG. 10 is a top view of a heat-sink including a shim projection with a corner radiuses of rectangular shape or square shape for a semiconductor package.

FIG. 10 is top view of heat-sink 1 wherein the shim projection has corner radiuses of rectangular shape or square shape for the semiconductor package. The shim projection with rectangular or square corner radiuses 18 scatters the stress peak on the ceramic frame due to the differentiation between the CTE of the copper heat-sink 1 and the ceramic frame 2.

The circular shim projection 17 and/or the rectangular shim projection 18 may be treated with an annealing process. The annealing process may soften the shim projection in order to release the stress due to the difference in CTE between the copper heat-sink 1 and the ceramic frame 2.

Figure 11:
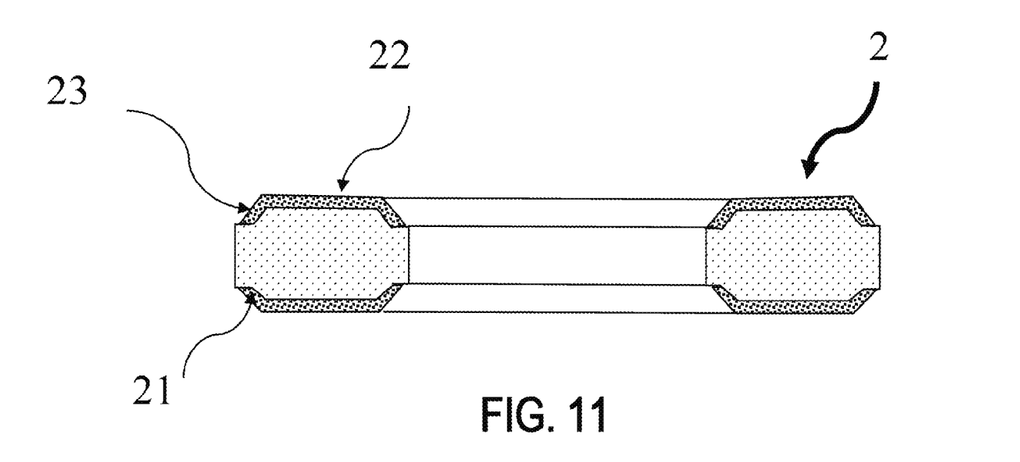
FIG. 11 is a cross section view of a ceramic frame including a metallization rundown on an edge chamfer for a semiconductor package.

FIG. 11 is a cross section view of ceramic frame 2 for the semiconductor package, which includes a metallization rundown on an edge chamfer. The ceramic frame 2 has the metallization 22 with a rundown of metallization 23 on an edge chamfer 21 to enhance the ceramic strength. If ceramic frame 2 has an edge chamfer, then the ceramic frame 2 may be made by a dry press method. The ceramic edge chamfer 21, metallization 22, and metallization rundown 23 may scatter the stress peak on the ceramic frame 2 due to the difference between the CTE of the copper heat-sink 1 and the ceramic frame 2.

Figure 12:
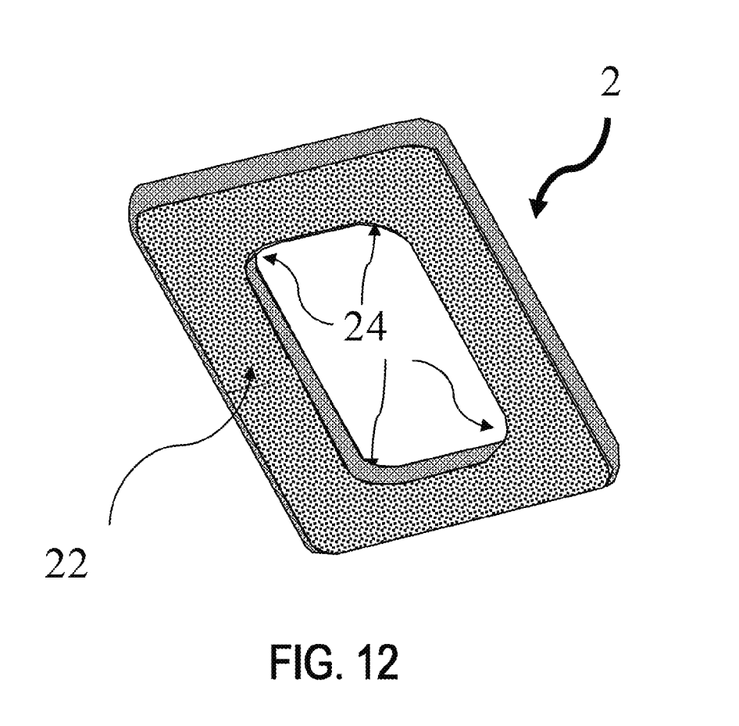
FIG. 12 is a bottom view of a ceramic frame including an inner corner radius and metallization for a semiconductor package.

FIG. 12 is a bottom view of ceramic frame 2, which includes an inside corner radius and metallization for the semiconductor package. The ceramic frame 2 has the inside corner radius 24 with the metallization 22. The inside corners of ceramic frame 2 distributes the peak stress on the ceramic frame caused by the difference between the CTE of the copper heat-sink 1 and the ceramic frame 2.

Figure 13:
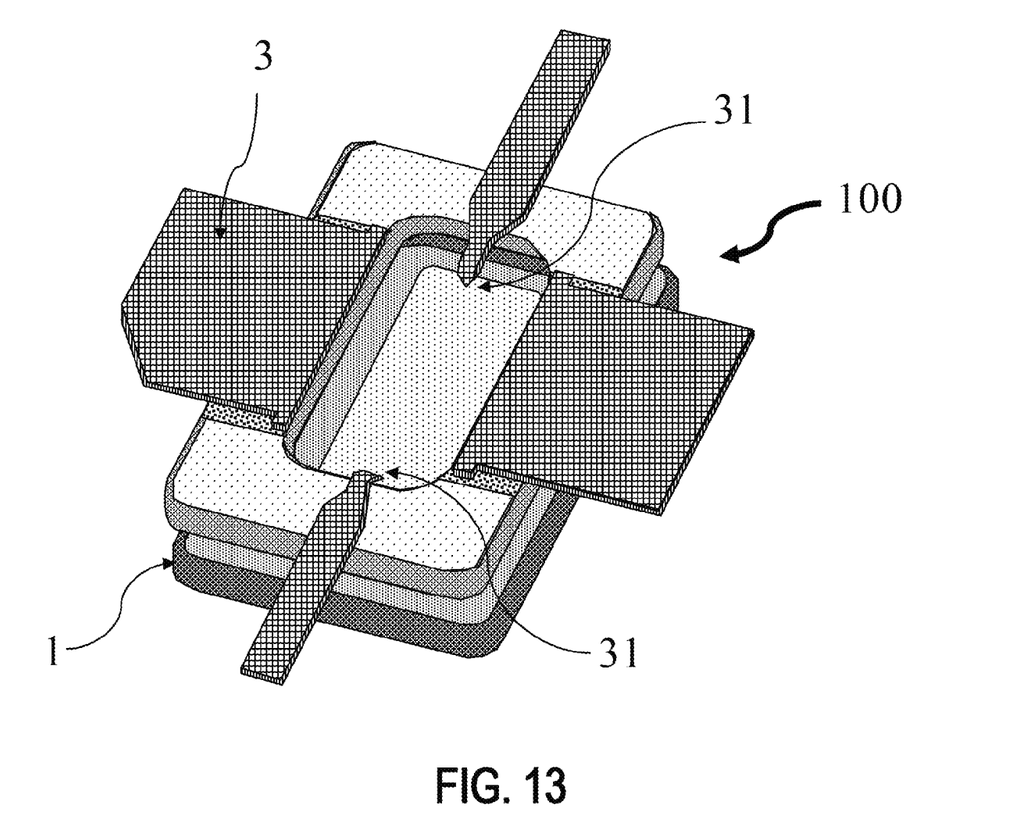
FIG. 13 is a top view of a semiconductor package with a dummy lead for electrolytic plating.

FIG. 13 is a top view of the semiconductor package 100 with a dummy lead 31 for electrolytic plating. The semiconductor package 100 has a lead frame 3 that is made by a stamping process. Making the lead frame 3 via a stamping process tends to lower costs in volume production. The lead frame 3 has a dummy lead 31 for an electrolytic plating contact, because the copper heat-sink 1 is electrically isolated from the lead frame 3.

Figure 14:
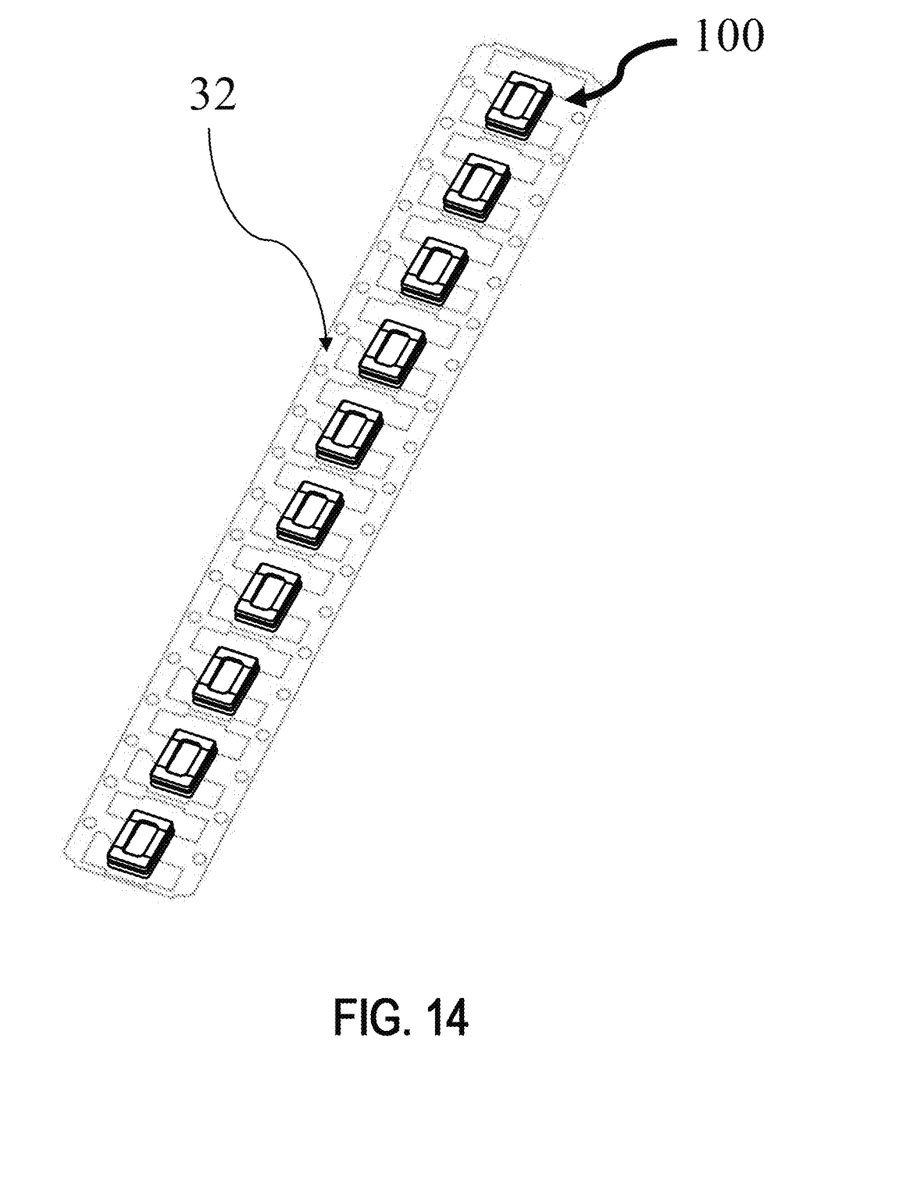
FIG. 14 is a top view of multiple parts on a strip form structure of the semiconductor package.

FIG. 14 is a top view of multiple parts on a strip form structure 32 for the semiconductor package. The semiconductor package 100 has multiple parts on a strip form structure 32, because of the smaller package size. In case of using multiple parts strip formed lead, the process cost has been reduced per parts for the semiconductor package and the packaging process as well.

The semiconductor package has electrolytic plating comprising a nickel plating, a palladium plating and a gold plating on the heat-sink, the lead frame and the metallization. The palladium plating including, but not limited to, pure Palladium (Pd), Palladium Cobalt alloy (Pd Co), Palladium Nickel alloy (Pa Ni), and Palladium Indium alloy (Pd In). The palladium plating provides a lower plating cost due to a thinner gold thickness and having a function as a diffusion barrier between the nickel plating and gold plating.

What is claimed is:

1. A semiconductor package comprising:
   a copper heat-sink comprising a shim projection, wherein the shim projection has a height (H)/width (W) ratio of greater than 1.0;
   a ceramic frame attached to the shim projection of the copper heat-sink; and
   a lead frame, wherein the lead frame is attached on the ceramic frame and the lead frame has a dummy lead for an electrolytic plating contact.

2. The semiconductor package of claim 1, wherein the copper heat-sink comprising the shim projection is made by a stamping process on a copper metal sheet.

3. The semiconductor package of claim 2, wherein the shim projection has a tapered structure.

4. The semiconductor of claim 2, wherein the copper heat-sink further comprises a pedestal for device mounting.

5. The semiconductor package of claim 4, wherein the stamping process is a progressive stamping process wherein the pedestal of the heat-sink is made on a first step and the shim projection of the heat-sink is made on a second step.

6. The semiconductor package of claim 1, wherein the copper heat-sink is treated with an annealing process.

7. The semiconductor package of claim 1, wherein the copper heat-sink has a convex structure.

8. The semiconductor package of claim 1 wherein the copper heat-sink has a stepped structure on a bottom surface.

9. The semiconductor package of claim 1, wherein the shim projection has a round shape from the top view.

10. The semiconductor package of claim 1, wherein the shim projection has corner radiuses on a rectangular shape.

11. The semiconductor package of claim 1, wherein the ceramic frame has an edge chamfer.

12. The semiconductor package of claim 11, wherein the ceramic frame has a metallization rundown on the edge chamfer.

13. The semiconductor package of claim 1, wherein the ceramic frame has inner corner radiuses on a cavity.

14. The semiconductor package of claim 1, wherein the ceramic frame has a high temperature fired metallization.

15. The semiconductor package of claim 14, wherein the heat-sink, the lead frame and the metallization have an electrolytic plating comprising a nickel plating, a palladium plating and a gold plating.

16. A semiconductor packaging structure comprising:
   a copper heat-sink, wherein the copper heat-sink has a shim projection and a pedestal, wherein the shim projection has a height (H)/width (W) ratio of greater than 1.0;
   a ceramic frame, which is attached to the shim-projection of the heat-sink;
   a lead frame, wherein the lead frame is attached on the ceramic frame and wherein the lead frame has a dummy lead for an electrolytic plating contact;
   a semiconductor device, wherein the semiconductor device is mounted on the pedestal;
   a capacitor, wherein the capacitor is mounted on the pedestal;
   a wire bond, wherein the wire bond connects the semiconductor device, and the capacitor; and
   a ceramic lid, wherein the ceramic lid has adhesive material to make a seal.

17. A semiconductor packaging structure comprising:
   a copper heat-sink, wherein the copper heat-sink has a shim projection and a pedestal, wherein the shim projection has a height (H)/width (W) ratio of greater than 1.0;
   a ceramic frame, which is attached to the shim-projection of the heat-sink;
   a metal lead frame, wherein the metal lead frame is attached on the ceramic frame and has a dummy lead for an electrolytic plating contact;
   a semiconductor device, wherein the semiconductor device is mounted on the pedestal;
   a capacitor, wherein the capacitor is mounted on the pedestal; and
   a sealing structure or an encapsulation, wherein the encapsulation covers the semiconductor device in the semiconductor package.

* * * * *